United States Patent
Gajek et al.

(10) Patent No.: US 10,446,742 B2
(45) Date of Patent: Oct. 15, 2019

(54) METHOD FOR MANUFACTURING A MAGNETIC MEMORY ELEMENT ARRAY USING HIGH ANGLE SIDE ETCH TO OPEN TOP ELECTRICAL CONTACT

(71) Applicant: Spin Memory, Inc., Fremont, CA (US)

(72) Inventors: Marcin Gajek, Berkeley, CA (US);
Eric Michael Ryan, Fremont, CA (US);
Mustafa Pinarbasi, Morgan Hill, CA (US)

(73) Assignee: SPIN MEMORY, INC., Fremont, CA (US)

( * ) Notice: Subject to any disclaimer, the term of this patent is extended or adjusted under 35 U.S.C. 154(b) by 26 days.

(21) Appl. No.: 15/866,394

(22) Filed: Jan. 9, 2018

(65) Prior Publication Data

US 2019/0214553 A1 Jul. 11, 2019

(51) Int. Cl.

| *H01L 43/12* | (2006.01) |
|---|---|
| *H01L 27/22* | (2006.01) |
| *H01L 43/02* | (2006.01) |
| *H01L 21/3213* | (2006.01) |
| *H01L 43/08* | (2006.01) |

(52) U.S. Cl.
CPC ........ *H01L 43/12* (2013.01); *H01L 21/32131* (2013.01); *H01L 27/228* (2013.01); *H01L 43/02* (2013.01); *H01L 43/08* (2013.01)

(58) Field of Classification Search
CPC ......... H01L 43/02; H01L 43/08; H01L 43/12; H01L 21/32131; H01L 27/228; G11C 11/16; G11C 11/161; G11C 2211/5615; G11B 5/3909
See application file for complete search history.

(56) References Cited

U.S. PATENT DOCUMENTS

| 9,660,177 B2* | 5/2017 | Annapragada | ........ H01F 41/308 |
|---|---|---|---|
| 2013/0267042 A1* | 10/2013 | Satoh | .................... H01L 27/222 438/3 |
| 2014/0170776 A1* | 6/2014 | Satoh | ...................... H01L 43/12 438/3 |
| 2016/0336509 A1* | 11/2016 | Jeong | ...................... H01L 43/12 |
| 2017/0062709 A1* | 3/2017 | Kim | ........................ H01L 43/12 |
| 2017/0256708 A1* | 9/2017 | Krounbi | .................. H01L 43/12 |

* cited by examiner

*Primary Examiner* — Michael M Trinh
(74) *Attorney, Agent, or Firm* — Zilka-Kotab, P.C.

(57) ABSTRACT

A method for manufacturing a magnetic memory element array. A plurality of magnetic memory elements are formed on a substrate, and a dielectric fill layer such as SiO2 or SiNx is deposited over the magnetic memory element pillars. An ion milling is then performed at a high angle (at least 70 degrees) relative normal to remove topographic dielectric features from areas over the magnetic memory elements. Optionally, additional ion milling processes can be performed at increasing angles relative to normal until the dielectric material has been removed from the areas over the magnetic memory elements.

18 Claims, 18 Drawing Sheets

METHOD FOR MANUFACTURING A MAGNETIC MEMORY ELEMENT ARRAY USING HIGH ANGLE SIDE ETCH TO OPEN TOP ELECTRICAL CONTACT

FIELD OF THE INVENTION

The present invention relates to magnetic random access memory (MRAM) and more particularly to a method for manufacturing magnetic a high density magnetic memory element array.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing a high density magnetic memory element array. Magnetic memory element pillars are formed over a substrate. Then, a dielectric material is deposited over the magnetic memory element pillars and substrate. A high angle ion milling is performed to remove a portion of the dielectric material, the high angle ion milling being performed at an angle of at least 70 degrees relative to normal with a rotating chuck.

After performing the first high angle ion milling, a second ion milling can be performed at an angle relative to normal that is greater than the angle of the first ion milling. Subsequent ion milling processes can be performed at increasing ion milling angles relative to normal until the dielectric material has been removed from areas over the magnetic memory element pillars.

Optionally, the magnetic memory element pillars can be formed by a process that uses a hard mask structure having an end point detection layer incorporated therein. The ion milling, or series of ion millings can be terminated when the end point detection layer has been reached and detected. The end point detection layer can be a material such as Mg, MgO or Cu which can be readily detected by a process such as secondary ion mass spectronomy (SIMS).

The above process advantageously avoids the need for chemical mechanical polishing (CMP) to planarize the dielectric material and open up the magnetic memory elements for electrical contact thereto. The use of chemical mechanical polishing is difficult to accurately control and leads to the possibility of contamination and damage to the magnetic memory elements. By avoiding the use of chemical mechanical polishing, the process avoids damage to the memory elements and avoids shorting between the magnetic memory elements.

In addition, the ion milling or sequential ion milling processes typically can be performed in-situ without breaking vacuum so as to further avoid damage to the magnetic memory elements. In this case, the ion beam etching module and the plasma vapor deposition module will be in the same cluster.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
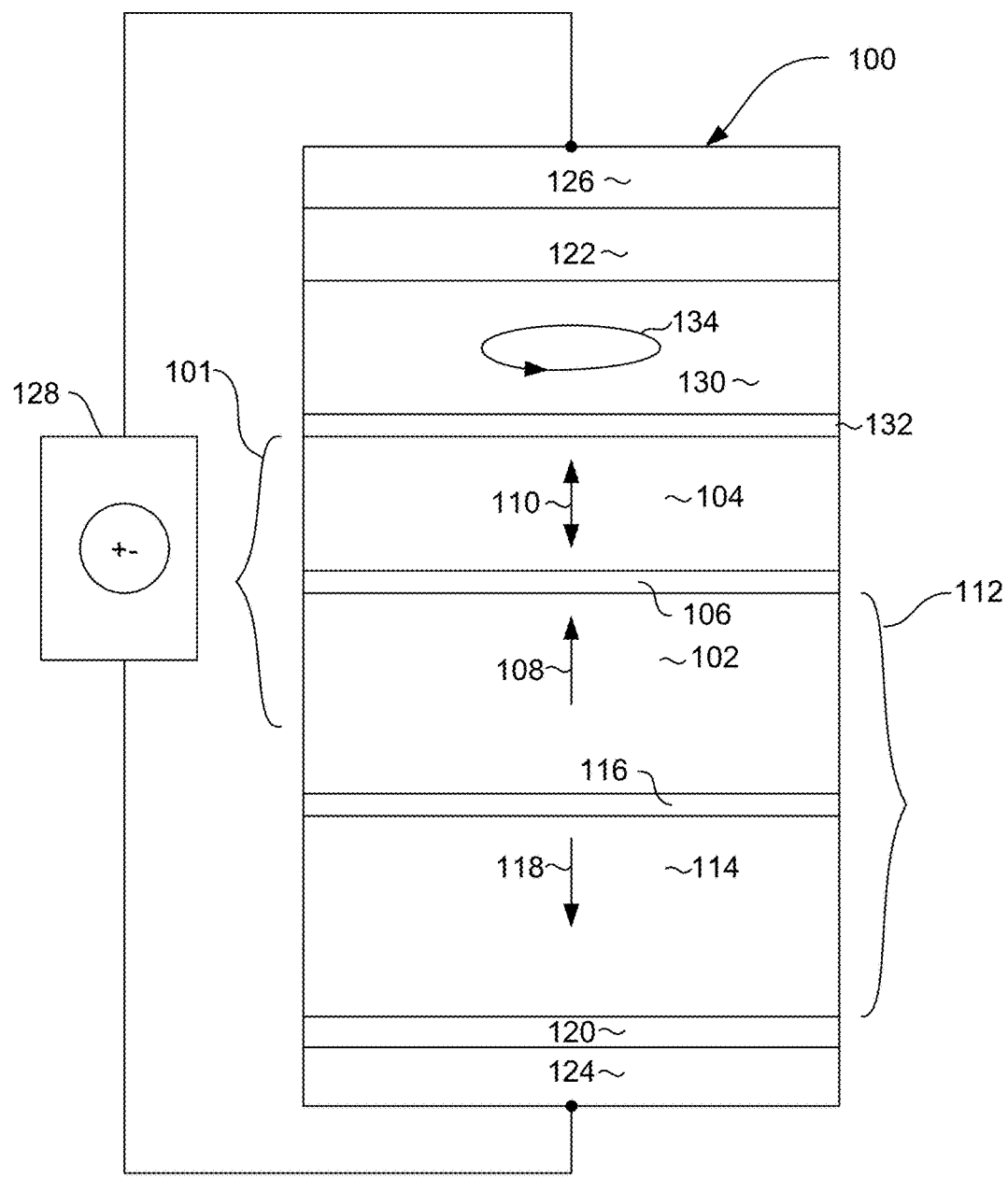
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Ta, W, and Al can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
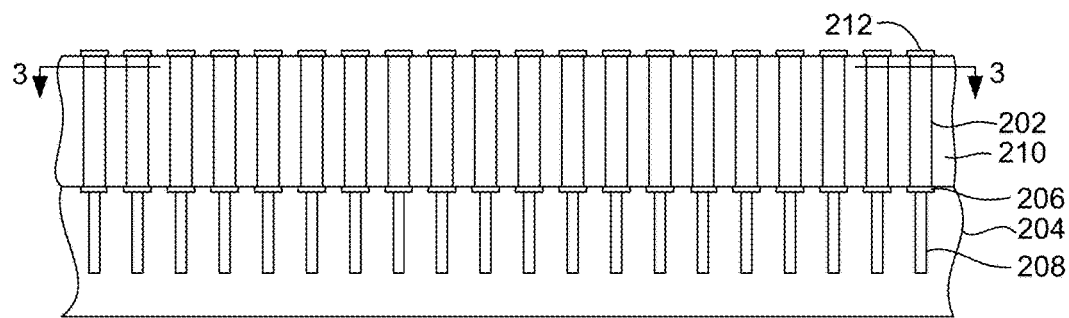
FIG. 2 is a side, cross sectional view of an array of magnetic random access memory elements formed on a substrate.

FIG. 2 shows a side, cross sectional view of an array 200 of magnetic random access memory elements 202 formed on a substrate 204. The substrate 204 can be a semiconductor material such as Si formed from a Si wafer. Each of the magnetic memory elements can be formed on an electrically conductive lead 206 that can connect the magnetic memory element 202 with underlying circuitry such as CMOS circuitry 208 embedded in the substrate 204. The memory elements 202 can be surrounded by an insulating material 210 such as $SiO_2$, $Si_3N_4$, SiC, TiN, or alumina $Al_2O_3$, and electrically conductive upper leads 212.

Figure 3:
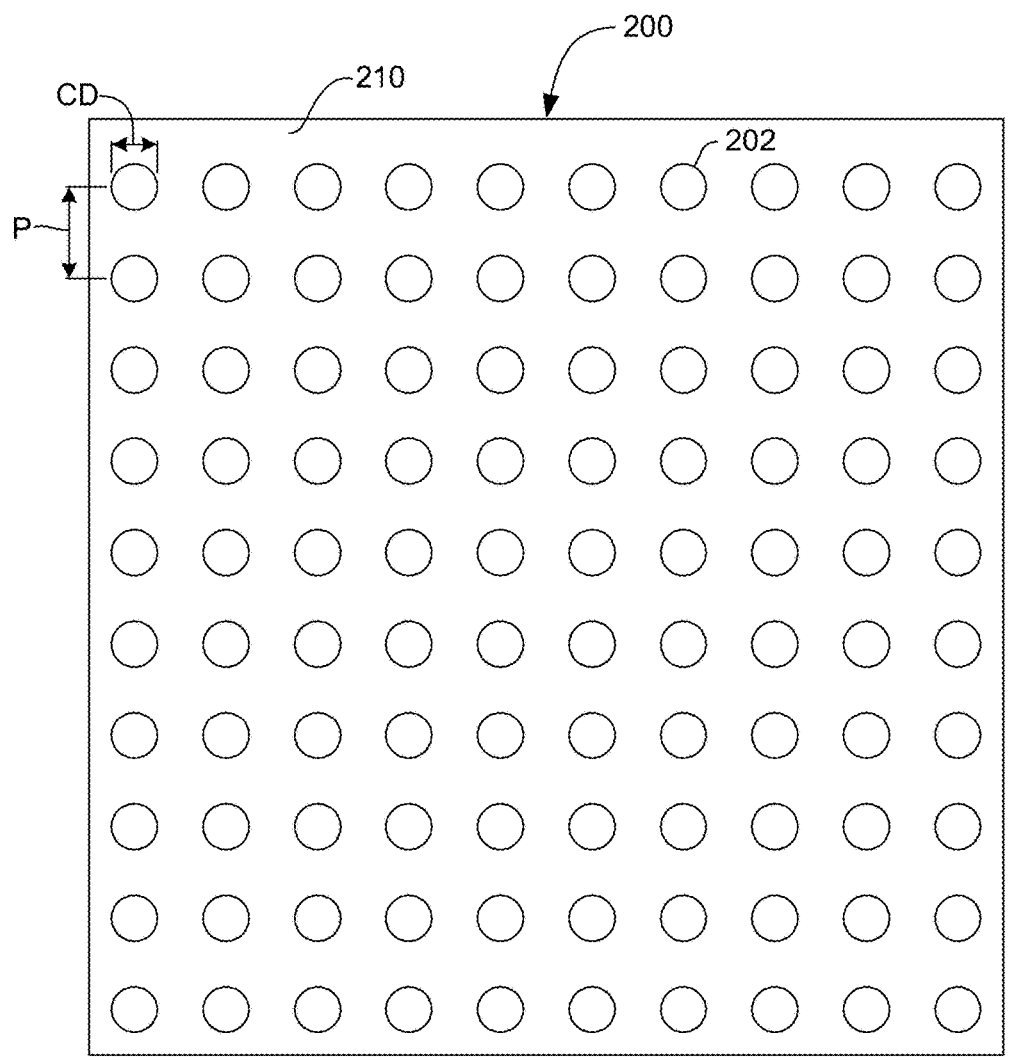
FIG. 3 is a top-down view of the array of magnetic random access memory elements as seen from line 3-3 of FIG. 2.

FIG. 3 shows a top-down, cross-sectional view as seen from line 3-3 of FIG. 2. From, both FIGS. 2 and 3, it can be seen that each of the magnetic memory elements 202 is formed as a cylindrically shaped pillar. In order to increase data density, it becomes necessary increase the number of memory elements 202 in a given area in the array 200. In FIG. 3, it can be seen that the distance between a given location on a memory element 202 to that same location on an adjacent magnetic memory element 202 defines a pitch (P) of the array. This size of each memory element 202 (in this case the diameter of the memory element cylinder) defines the feature size (CD).

As shown in FIG. 2, the memory element pillars 202 are embedded in a dielectric material 210 that electrically isolates the memory elements 202 from one another. The construction of such a memory element array can be produced by forming the memory element pillars 202, and then depositing a dielectric fill material 210 to electrically insulate the memory elements 202 form one another.

One of the many challenges in manufacturing memory elements arrays lies in forming the top and bottom electrodes without creating unwanted shorting between memory elements as well as spurious shorts between the top and bottom electrodes of the array. A particularly challenging step is the selective removal of dielectric encapsulation from the top of each of the memory element pillars 202. One technique that can be used is to planarize the structure and remove the dielectric material by a chemical mechanical polishing (CMP) step until the top electrode of each of the pillars has been exposed. However, the CMP step is difficult to control and also involves a wet step. This CMP leads to contamination as a result of the need to break vacuum and expose the wafer to atmospheric and other contamination.

The CMP process also induces surface scratching, and is highly dependent on the density of the features in the array and, therefore, is prone to non-uniformity. In addition, previously used processes such as reactive ion etching or ion milling as have required a later planarization step such as chemical mechanical polishing leading to similar above described challenges.

A process, embodiments of which are described herein below, overcomes these challenges by providing a method for processing and removing dielectric material to open up the tops of the memory element contacts without the need for chemical mechanical polishing and the issues that would ensue therefrom.

Figure 4:
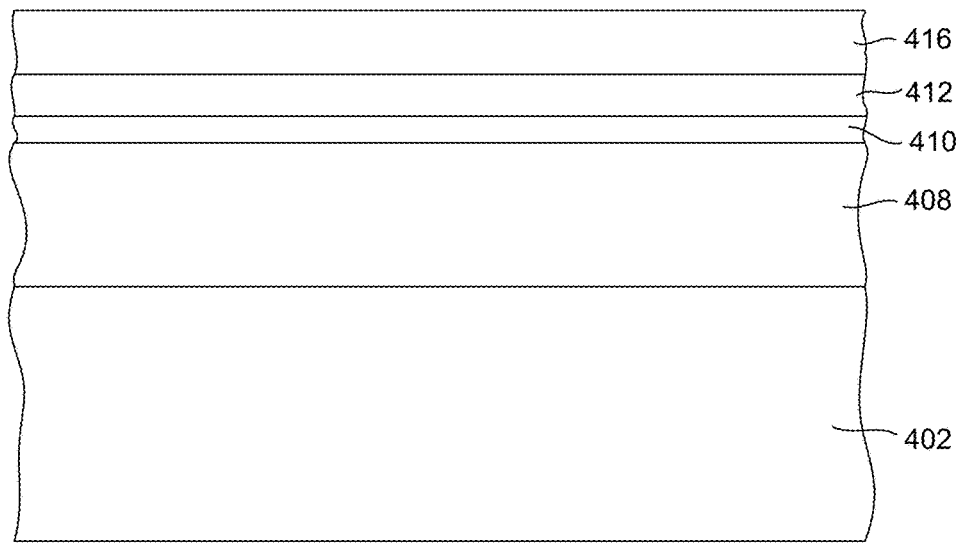
FIGS. 4-12, are views of a wafer in various intermediate stages of manufacture, illustrating a method for manufacturing an array of magnetic random access memory elements.

With reference to FIG. 4, a memory element material 408 is deposited over a substrate 402. Although not shown, the substrate can include embedded circuitry such as CMOS circuitry and electrically conductive vias for making electrical connection between the memory elements and other electronics. Also, although the memory element material 408 is shown as a single layer in FIG. 4, this is for purposes of simplicity. The memory element layer 408 would actually include various layers necessary to form a magnetic memory element such as the memory element 100 of FIG. 1, or some other suitable memory element.

A hard mask material 410 such as SiN or carbon is deposited over the memory element material. One or more optional anti-reflective coating layers 412 may be deposited over the hard mask layer 410 and a photoresist layer 416 is deposited over the anti-reflective coating 412 and hard mask 410.

Figure 5:
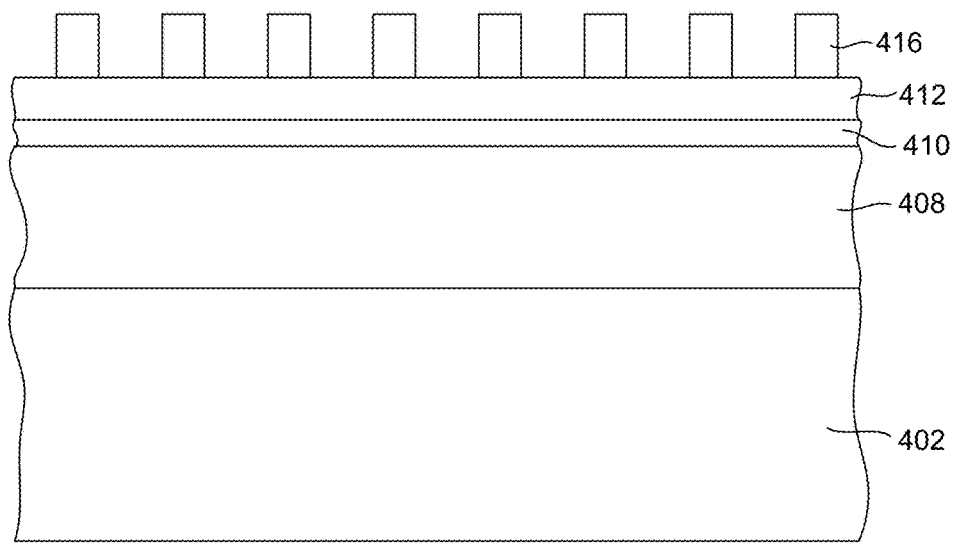
Figure 6:
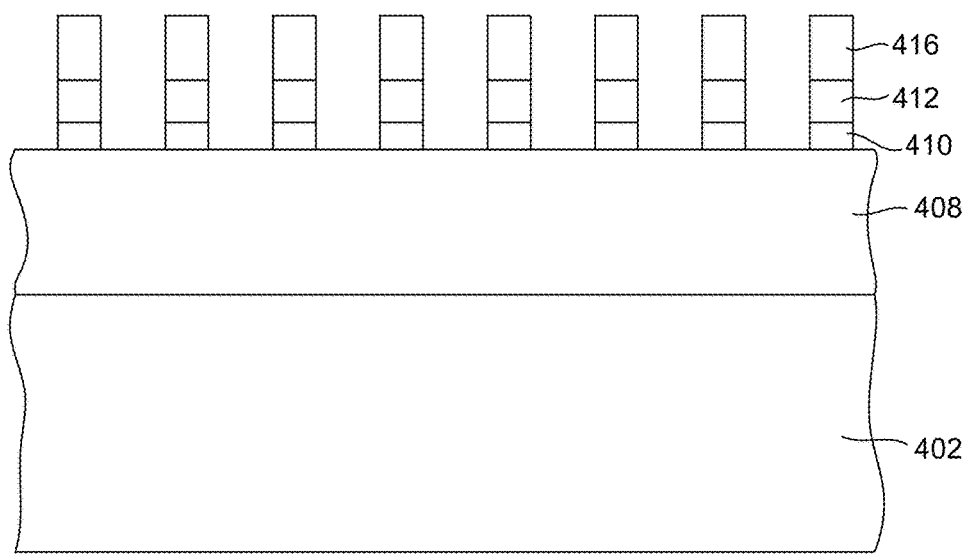

With reference now to FIG. 5, the photoresist 416 is patterned (such as by photolithography or electron beam exposure) to form a mask structure having mask portions that are configured to define an array of memory elements. A material removal process such as reactive ion etching (RIE) can then be performed to remove portions of the layers 412, 410 that are not protected by the photoresist mask 416 to transfer the image of the mask 416 onto the layers 412, 410, leaving a structure such as shown in FIG. 6.

Figure 7:
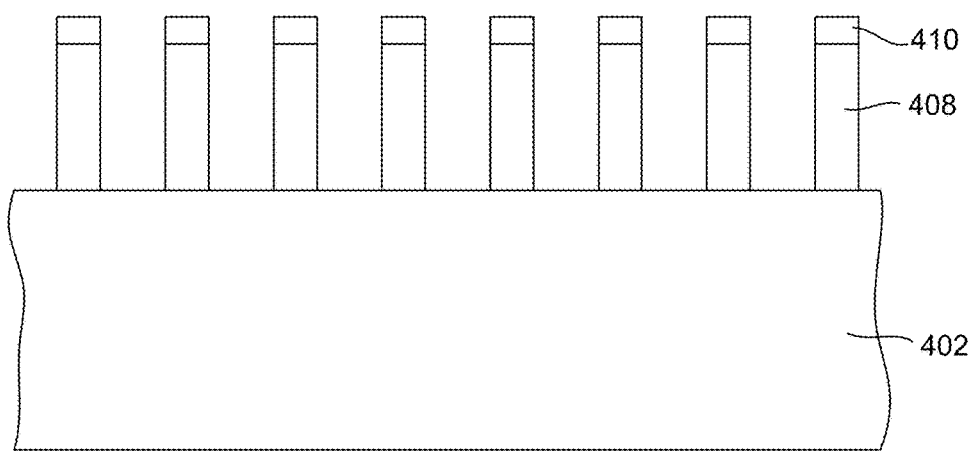

With reference to FIG. 7, an ion milling or some other suitable material removal process is performed to remove portions of the magnetic memory element material 408 that are not protected by the patterned hard mask 410 to form a plurality of memory element pillars. The ion milling may remove some or all of the layers 412, 416 (FIG. 5), but the hard mask 410 will remain substantially intact during the pillar defining ion milling process step.

Figure 8:
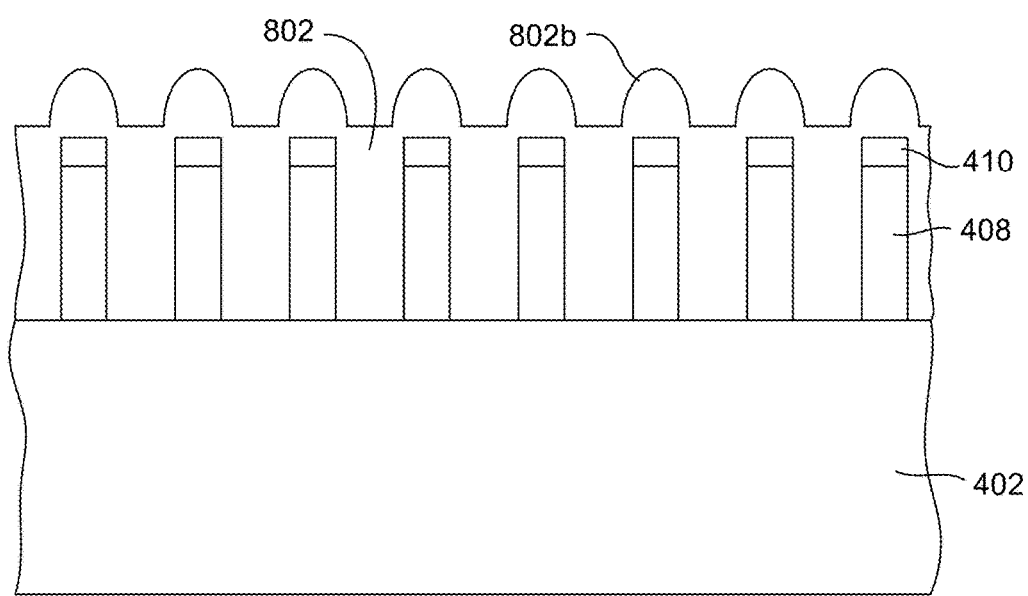

Then, with reference to FIG. 8, a dielectric material 802 is deposited over the formed memory element pillars 408 and remaining hard mask 410. The dielectric material can be a material such as $SiO_2$ or $Si_3N_4$ and is deposited to a thickness that is at or above the level of the hard mask 410. The dielectric layer 802 can be deposited by a process such as plasma vapor deposition (PVD) in a deposition chamber. As can be seen in FIG. 8, the deposited dielectric material 802 has an extreme topography as a result of being deposited over the pillar structures 408. As a result, the dielectric includes tall raised features 802b over each of the pillars 408. In order to produce a useable memory element array it is necessary to remove these raised portions 802b sufficiently to open up the tops of the memory elements 408 and remaining hard mask 410. As discussed above, chemical mechanical polishing (CMP) could be used to accomplish this. However, CMP is a difficult to accurately control and can lead to contamination of the memory elements and shorting between the memory elements 408.

Figure 9:
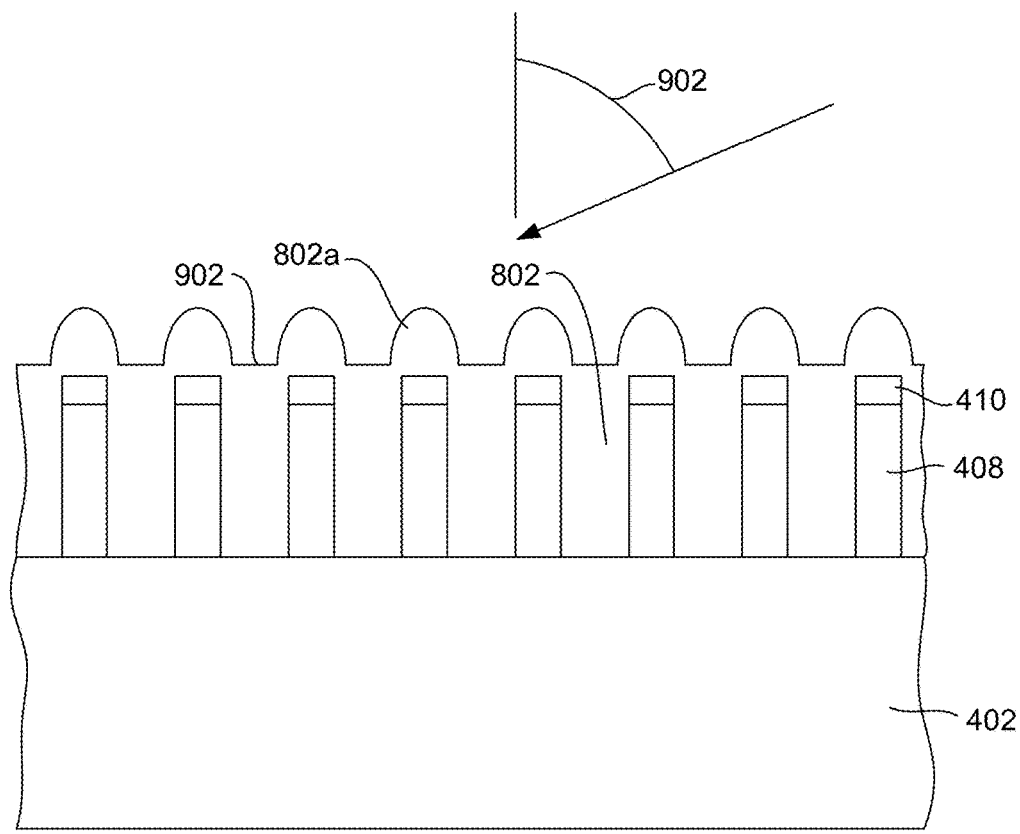

With reference to FIG. 9, a first ion milling is performed at a high angle relative to normal. The ion milling is preferably performed at an angle 902 that is at least 70 degrees relative to normal. The ion milling is performed while rotating the chuck on which the wafer is mounted. This high angle ion milling advantageously removes the high topography features at a faster rate than the field (non-raised portions) of the dielectric fill layer 802. At this relatively high angle of ion milling, shadowing from the raised topographic features 802a reduces the effect of the ion milling in the field areas 902 between the raised features 802a, causing the raised features 902a to be removed faster than the field regions 902. This shadowing effect is increased at very high density arrays where the raised features 802a over the pillar structures 408 are very close together.

Figure 15:
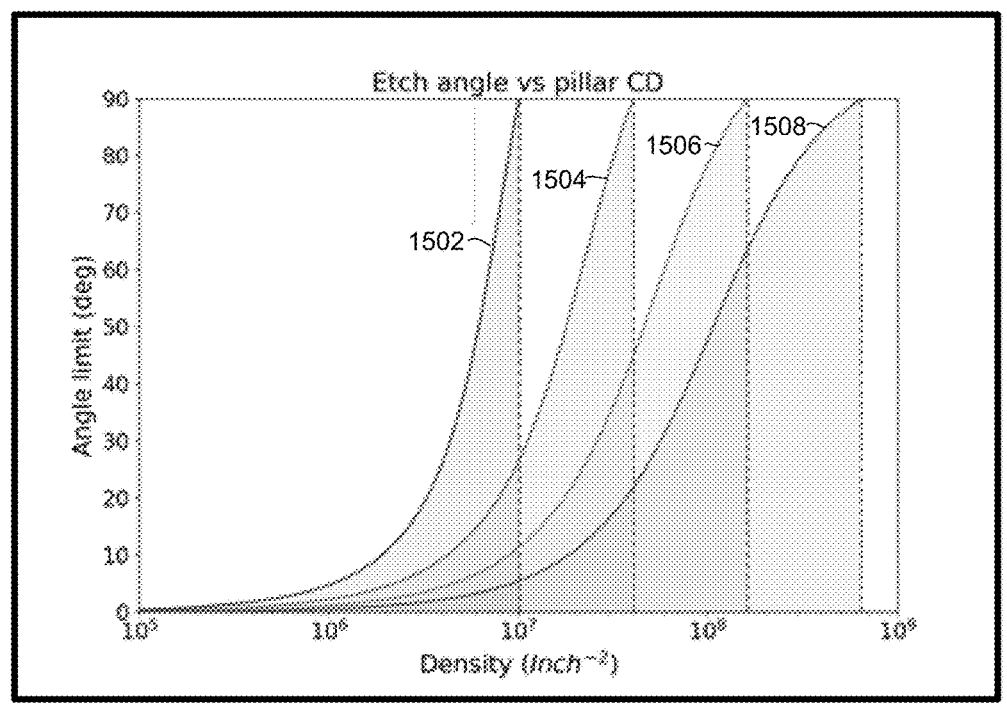
FIG. 15 is a graph illustrating etch angle limit verses memory element density for various memory element critical dimensions (e.g. width)
Figure 16:
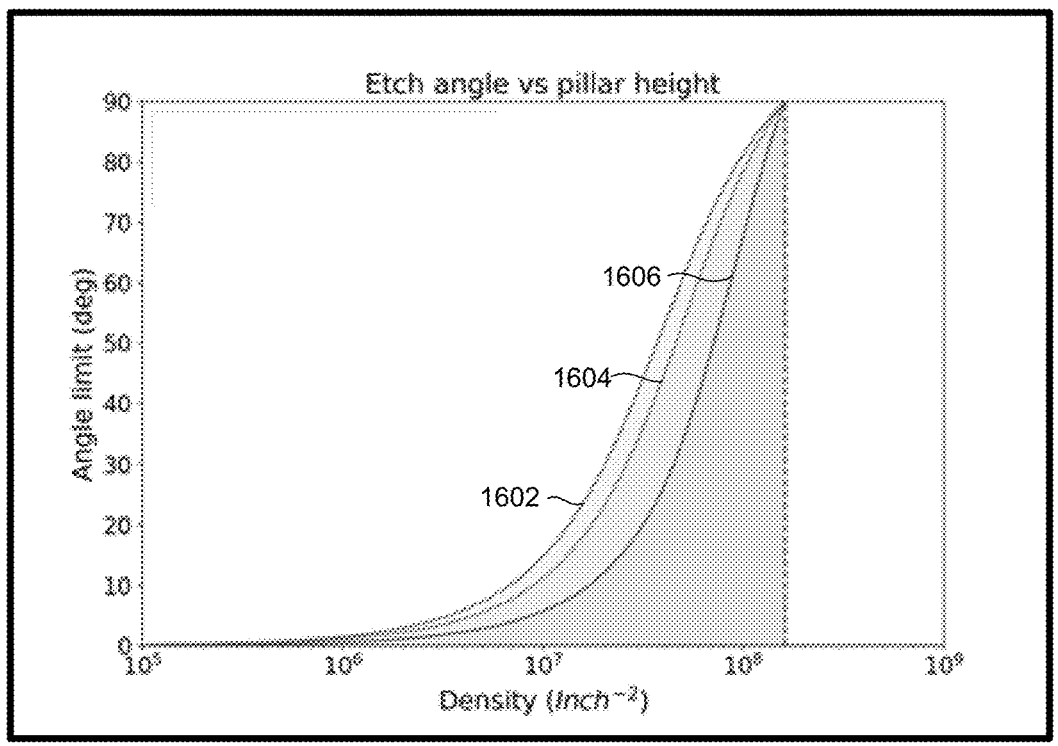
FIG. 16 is a graph illustrating a relationship between etch angle limit and memory element density for various memory element heights.

This effect is further illustrates with reference to FIGS. 15 and 16, which illustrate how angled ion milling is effected by the density and feature size of the pillar structures. FIG. 15 shows ion milling angles as a function of feature density for various feature critical dimensions (CD). Line 1502 shows ion milling angle limits relative to feature density for a feature having a CD of 80 nm. Line 1504 shows ion milling angle limits for a feature CD of 40 nm. Line 1506 shows ion milling angle limits for a feature CD of 20 nm, and line 1508 shows the ion milling angle limits for a feature height of 10 nm.

FIG. 16 shows ion milling angle limits relative to feature density for various feature h such as pillar height. Line 1602 shows the ion milling angle limit for a feature height of 80 nm. Line 1604 shows ion milling angle limits for a feature height of 60 nm, and line 1606 shows the ion milling angle limits for a feature height of 30 nm.

The ion milling angle limits are the point at which shadowing from the features prevents material from being removed in the regions between the features (field area). As can be seen, as the density increases, a higher angle can be used. Also, however, it can be seen that taller features heights and critical dimensions (CD) also increase the limit angle at which shadowing occurs. This becomes more significant as the topographic features 802b of the dielectric material 802 (FIG. 9) are reduced by the ion milling.

Figure 10:
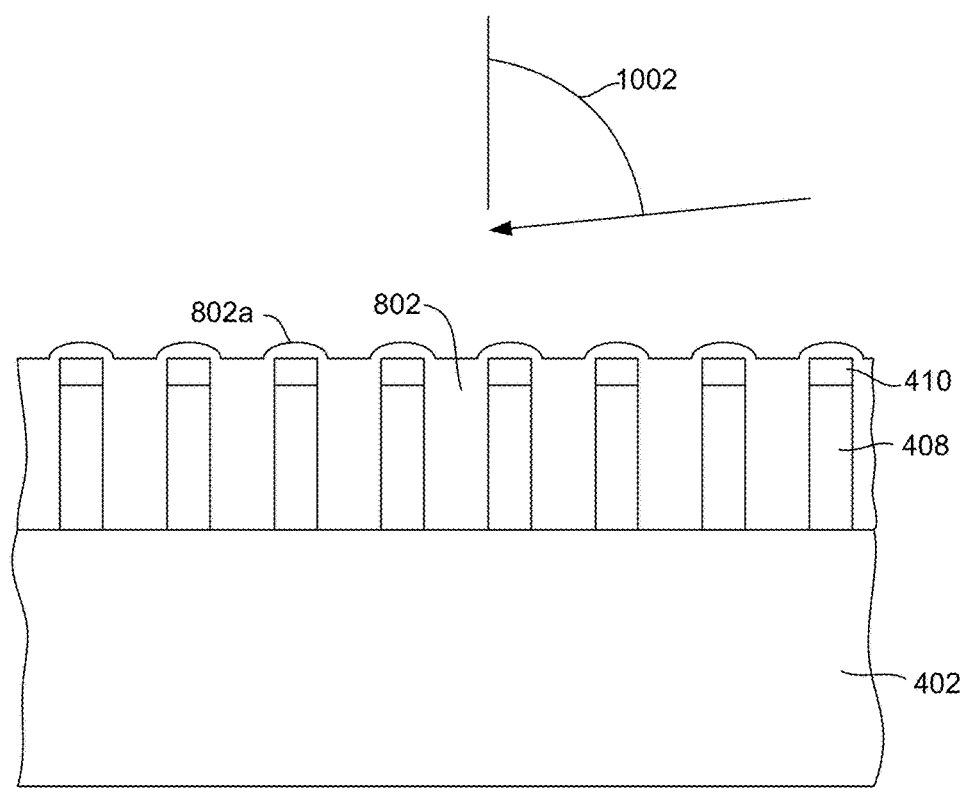

With reference again to FIG. 9, the ion milling (with a rotating chuck) performed at an angle 902 (preferably greater than 70 degrees relative to normal) preferentially removes the raised topographic features 802a faster than the dielectric material 802 between the raised features 802. This results in a reduced height of the topographic features 802a, as shown in FIG. 10. As the height of the topographic features 802a of the dielectric material 802 decreases, a higher ion milling angle 1002 is required to maintain the preferential removal of the topographic features 802a at a faster rate than the dielectric material 802 between the topographic features 1002. For example, this second ion milling angle 1002 can be an angle of 80 degrees or greater. This second ion milling is also performed with rotation of the chuck and wafer held thereon.

Figure 11:
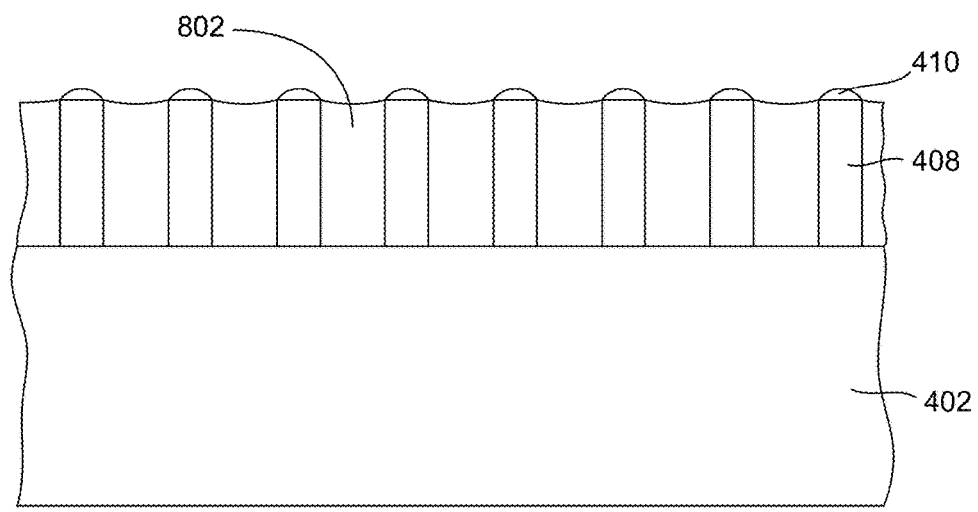

The above described two different ion milling angles being used. However, this is by way of example. In a more general sense, as the height of the dielectric topographic features 802a is reduced, the angle of the ion milling is increased to keep removing the raised topographic features 802 at a faster rate than the regions between the features 802a. A series of ion millings at increasing ion milling angles can be performed. Eventually, this series of ion milling at successively removes the raised portions of dielectric material 802 over the pillars 408, leaving a structure such as that shown in FIG. 11, with the hard mask layer 410 exposed.

Figure 12:
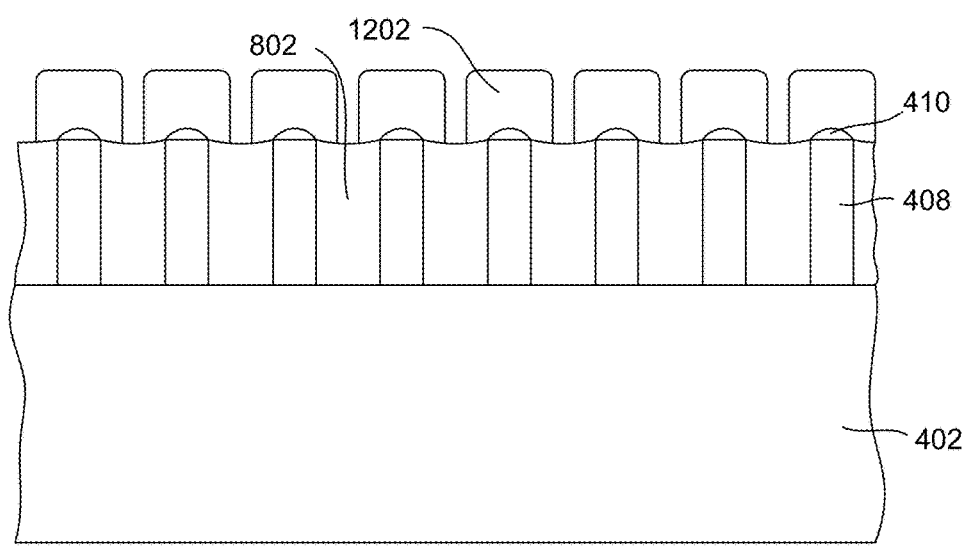

With the hard mask layer 410 exposed, upper electrical contact structures 1202 can be formed to make electrical contact with the hard mask 410 and pillar structures as shown in FIG. 12. The upper electrical contact structures 1202 can be formed of an electrically conductive metal such as Ta, Al, and Cu can be formed by a masking and electroplating process or some other suitable process such as PVD deposition, followed by lithographic patterning and RIE Etching.

Figure 13:
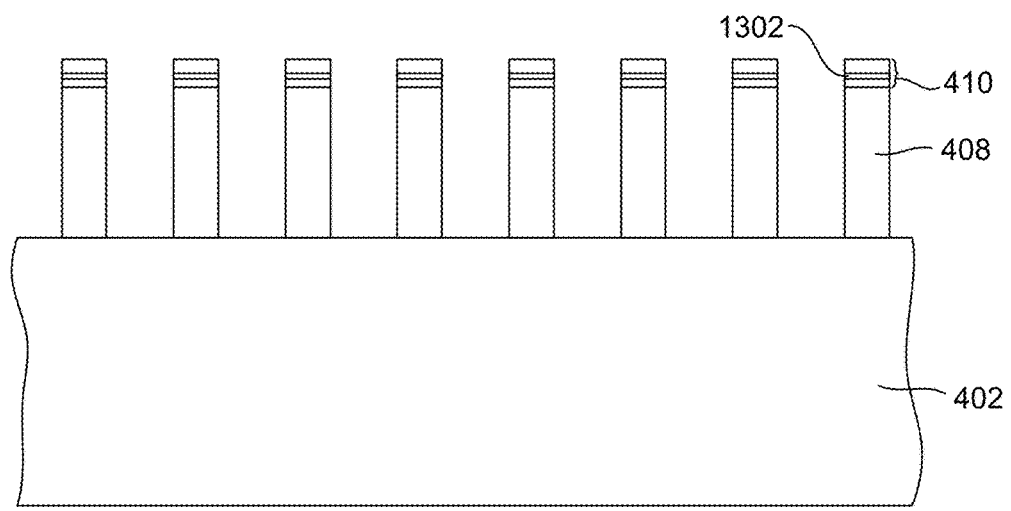
FIGS. 13-14 are views of a wafer in various intermediate stages of manufacture, illustrating a method for manufacturing an array of magnetic random access memory elements according to an alternate embodiment.
Figure 14:
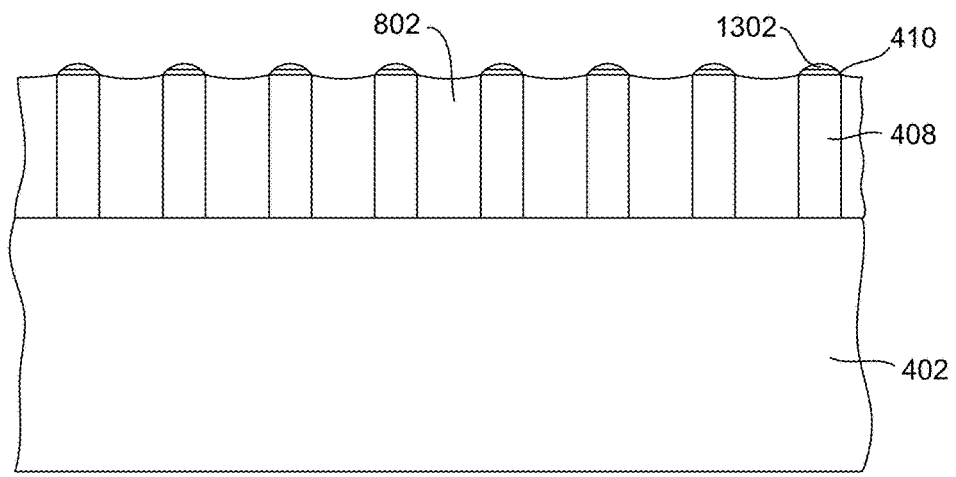

FIGS. 13-14 illustrate an alternate method for manufacturing a magnetic memory array, wherein an endpoint detection layer is incorporated into the hard mask layer. FIG. 13 shows a view similar to FIG. 7, except that in FIG. 13, the hard mask layer 410 has an etching endpoint detection layer 1302 incorporated therein. The endpoint detection layer 1302 can be a material such as Mg, MgO, or Cu, which can be easily detected during ion milling such as by secondary ion mass spectroscopy (SIMS).

A dielectric material such as $SiO_2$ or $Si_3N_4$ is deposited, and the series of high angle ion milling processes described above are then performed to remove tall topographic portions 802a of the dialect material layer 802, leaving a structure as shown in FIG. 14. The angled ion milling process can be terminated when the end point detection layer 1302 has been detected. Ordinarily, detecting such an endpoint detection layer in such a small feature size would not be practical. However, at the very high densities of a magnetic random access memory array, such as used here, the endpoint detection layer 1302 can be readily detected.

Figure 17:
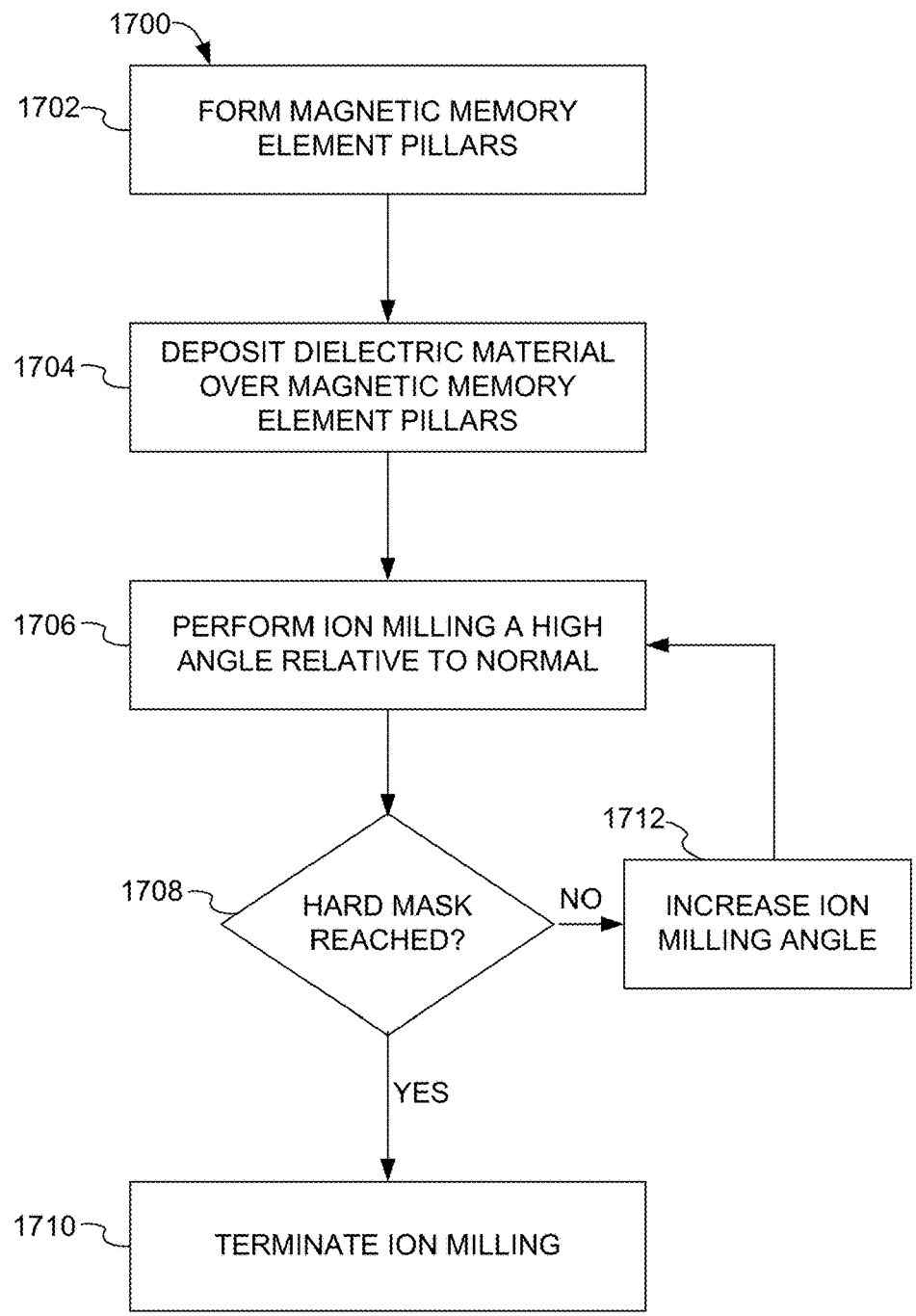
FIG. 17 is a flowchart illustrating a method for manufacturing a magnetic memory element array.

The above described process for manufacturing a magnetic memory array can be further understood with reference to FIG. 17, which shows a flowchart illustrating a process 1700 for manufacturing a magnetic memory array. In a step 1702, a plurality of magnetic memory element pillars are formed on a substrate. The plurality of memory element pillars are formed with a hard mask layer leftover as a remnant of the formation process. Then, in a step 1704 a dielectric layer is deposited over the magnetic memory element pillars and hard mask layers. The dielectric material can be a material such as $SiO_2$ or $SiN_x$, and is preferably deposited at least to level that is equivalent to the height of the memory element pillars and hard mask layer. Then, in a step 1706 an ion milling process is performed. The ion milling process is performed at a high angle (at least 70 degrees) relative to normal while rotating a chuck on which the wafer is held.

Then, in a decision step 1708 a determination is made as to whether sufficient dielectric material has been removed that the hard mask has been reached. If no, then another ion milling process is performed at an increased angle relative to normal with a rotating chuck. If the hard mask has been reached, the ion milling process can be terminated in a step 1710. Again, an end point detection layer such as Mg can be incorporated into the hard mask to facilitate the determination as to whether the hard mask layer has been reached in the decision step 1708.

Figure 18:
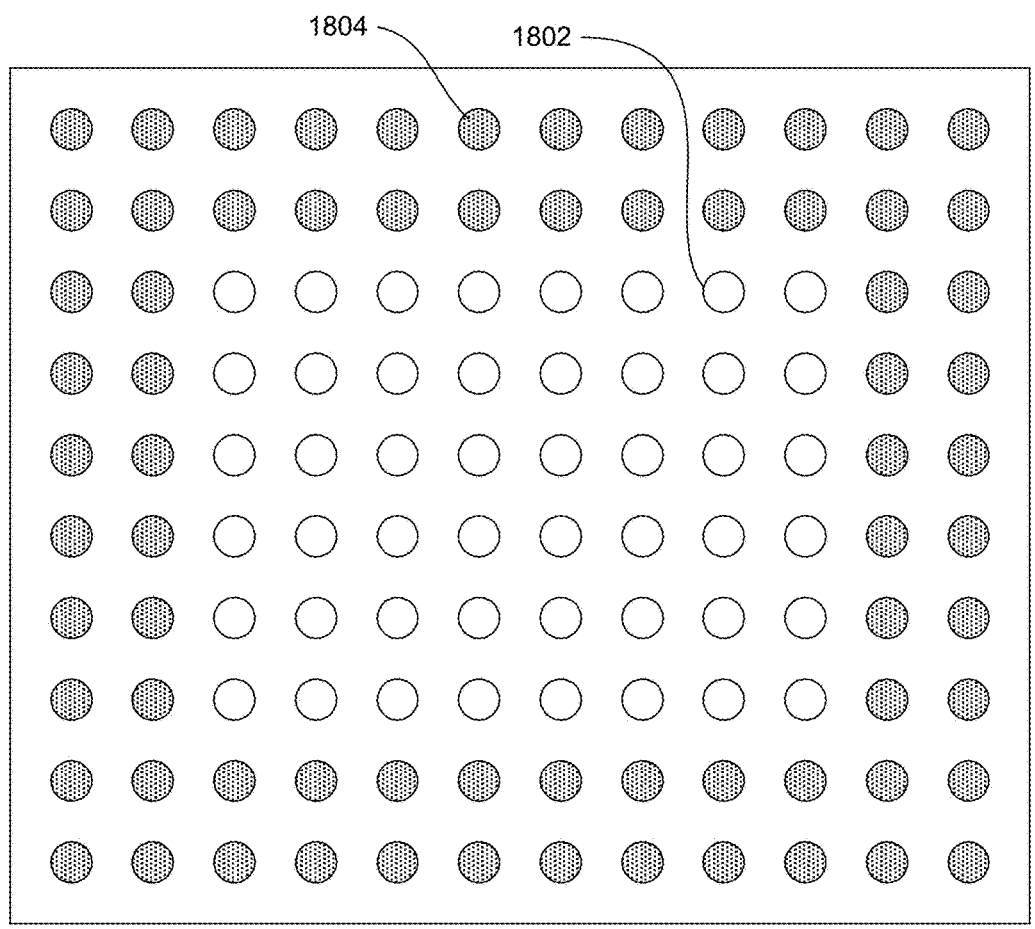
FIG. 18 is a top down view of a portion of a wafer on which memory element pillars are formed, according to an embodiment.

With reference to FIG. 18, in another embodiment, several rows and columns of dummy MTJ pillars 1804 (not connected to a any electrode) can be used in order to avoid a shorting of the top electrode to the side of the array. In this embodiment, an array of actual functioning pillar elements 1802 is surrounded by a series of dummy pillar elements 1804. The Dummy elements 1804 can be located at an outer portion of the wafer on which they are formed. The presence of these dummy pillar elements 1804 help to ensure that all of the actual functioning pillar elements 1802 experience the same, uniform shadowing effect from adjacent pillar structures. This, therefore, prevents some of the functional pillar elements 1802 at outer portions of the wafer from having a different ion milling effect than the inner pillar elements 1802.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for manufacturing high density pillar structures, the method comprising:
    forming magnetic memory element pillars over a substrate;
    depositing a dielectric material over the magnetic memory element pillars and substrate;
    performing a first high angle ion milling to remove a portion of the dielectric material, the high angle ion milling being performed at an angle of at least 70 degrees relative to normal with a rotating chuck; and
    after performing the first ion milling, performing a second ion milling at an angle relative to normal that is greater than the angle of the first ion milling.

2. The method as in claim 1, further comprising performing sequential ion milling processes at increasing angles relative to normal.

3. The method as in claim 1, wherein the magnetic memory element pillars are formed with a hard mask structure at their top, the method further comprising performing sequential ion milling processes at increasing angles relative to normal and terminating the ion milling when the hard mask has been exposed.

4. The method as in claim 1, wherein the dielectric material comprises one or more of $SiO_2$, $Si_3N_4$, SiC or $Al_2O_3$.

5. The method as in claim 1, wherein the dielectric material is deposited at least to the height of the top of the magnetic memory element pillars.

6. The method as in claim 1, wherein the magnetic memory element pillars are formed with hard mask layers at their top and wherein the dielectric layer is deposited at least to the level of the hard mask layer.

7. The method as in claim 1, wherein the forming of the magnetic memory element pillars further comprises:
    depositing a magnetic memory element layer;
    depositing a hard mask layer;
    depositing a photoresist layer;
    photolithographically patterning the photoresist layer to form a photoresist mask;
    performing a reactive ion etching to transfer the image of the photoresist mask onto the hard mask; and
    performing an ion milling to remove portions of the magnetic memory element that are not protected by the hard mask to form magnetic memory element pillars.

8. The method as in claim 7, wherein the ion milling process used to form the magnetic memory element pillars is performed at one or more angles relative to normal to form vertical side walls on the magnetic memory element pillars.

9. A method for manufacturing high density pillar structures, the method comprising:
    forming magnetic memory element pillars over a substrate, the memory element pillars having a hard mask layer formed at their top, the hard mask layer having an end point detection layer incorporated therein;
    depositing a dielectric material over the magnetic memory element pillars and substrate;
    performing a first high angle ion milling to remove a portion of the dielectric material, the high angle ion milling being performed at an angle of at least 70 degrees relative to normal with a rotating chuck; and
    after performing the first ion milling performing a second ion milling at an angle relative to normal that is greater than the angle of the first ion milling.

10. The method as in claim 9, wherein the end point detection layer comprises Mg.

11. The method as in claim 9, further comprising performing sequential ion milling processes at increasing angles relative to normal.

12. The method as in claim 9, further comprising performing sequential ion milling processes at increasing angles relative to normal and terminating the ion milling when the end point detection layer has been detected.

13. The method as in claim 9, further comprising after performing the ion milling performing a second ion milling at an angle relative to normal that is greater than the angle of the first ion milling, and terminating the second ion milling when the end point detection layer has been detected.

14. The method as in claim 9, further comprising terminating the ion milling process when the end point detection layer has been detected, the end point detection layer being detected by secondary ion mass spectroscopy.

15. The method as in claim 9, wherein the dielectric material comprises one or more of $SiO_2$, $Si_3N_4$, SiC or $Al_2O_3$.

16. The method as in claim 9, wherein the dielectric material is deposited at least to the height of the top of the magnetic memory element pillars.

17. The method as in claim 9, wherein the dielectric layer is deposited at least to the level of the hard mask layer.

18. The method as in claim 9, wherein the forming of the magnetic memory element pillars further comprises:
    depositing a magnetic memory element layer;
    depositing the hard mask layer;
    depositing a photoresist photoreisist layer;
    photolithographically patterning the photoresist layer to form a photoresist mask;
    performing a reactive ion etching to transfer the image of the photoresist mask onto the hard mask; and
    performing an ion milling to remove portions of the magnetic memory element that are not protected by the hard mask to form magnetic memory element pillars.

* * * * *

UNITED STATES PATENT AND TRADEMARK OFFICE
CERTIFICATE OF CORRECTION

PATENT NO. : 10,446,742 B2
APPLICATION NO. : 15/866394
DATED : October 15, 2019
INVENTOR(S) : Marcin Gajek et al.

It is certified that error appears in the above-identified patent and that said Letters Patent is hereby corrected as shown below:

In the Claims

Column 10, Line 51 please replace "photoresist photoreisist layer;" with --photoresist layer;--.

Signed and Sealed this
Ninth Day of June, 2020

Andrei Iancu
*Director of the United States Patent and Trademark Office*